United States Patent
Iwagami et al.

(10) Patent No.: US 7,821,134 B2
(45) Date of Patent: Oct. 26, 2010

(54) SEMICONDUCTOR DEVICE, ELECTRONIC DEVICE AND FABRICATION METHOD OF THE SAME

(75) Inventors: Norikazu Iwagami, Yamanashi (JP); Masaomi Emori, Yamanashi (JP)

(73) Assignee: Eudyna Devices, Inc., Yamanashi (JP)

( * ) Notice: Subject to any disclaimer, the term of this patent is extended or adjusted under 35 U.S.C. 154(b) by 828 days.

(21) Appl. No.: 11/655,237

(22) Filed: Jan. 19, 2007

(65) Prior Publication Data

US 2007/0200240 A1    Aug. 30, 2007

(30) Foreign Application Priority Data

Feb. 28, 2006    (JP) .............................. 2006-054174

(51) Int. Cl.
*H01L 23/48* (2006.01)
*H01L 23/52* (2006.01)
*H01L 29/40* (2006.01)

(52) U.S. Cl. ................ 257/758; 257/529; 257/E23.149

(58) Field of Classification Search ................ 257/529, 257/758, E23.149
See application file for complete search history.

(56) References Cited

U.S. PATENT DOCUMENTS

| | | | |
|---|---|---|---|
| 6,323,528 B1 | 11/2001 | Yamazaki et al. | 257/411 |
| 6,836,010 B2 | 12/2004 | Saeki | 257/694 |
| 6,870,265 B2 | 3/2005 | Kurimoto et al. | 257/758 |
| 6,977,442 B2 | 12/2005 | Akagawa et al. | 257/780 |
| 2001/0039113 A1 | 11/2001 | Blalock et al. | 438/629 |
| 2002/0090786 A1 | 7/2002 | Kim et al. | 438/300 |
| 2004/0183155 A1* | 9/2004 | Seto et al. | 257/529 |
| 2005/0130388 A1 | 6/2005 | Suh | 438/438 |
| 2005/0142841 A1 | 6/2005 | Lee | 438/622 |
| 2005/0212130 A1* | 9/2005 | Imai | 257/737 |
| 2006/0009023 A1* | 1/2006 | Nair et al. | 438/614 |
| 2007/0246828 A1* | 10/2007 | Nakatani | 257/737 |

FOREIGN PATENT DOCUMENTS

| | | |
|---|---|---|
| DE | 197 45 575 A1 | 4/1998 |
| EP | 0 104 079 A2 | 3/1984 |
| JP | 9-205096 | 8/1997 |
| TW | I247373 | 1/2006 |
| TW | I248148 | 1/2006 |
| TW | I248654 | 2/2006 |

OTHER PUBLICATIONS

European Search Report dated Jul. 12, 2007.
Taiwanese Notice of Allowance dated Jun. 4, 2010 with a Search Report (with partial English translation).

* cited by examiner

*Primary Examiner*—Mary Wilczewski
*Assistant Examiner*—Telly D Green
(74) *Attorney, Agent, or Firm*—Kratz, Quintos & Hanson, LLP (57) ABSTRACT

A semiconductor device includes a lower pad layer, an insulating layer and an upper pad layer. The lower pad layer is provided on a semiconductor substrate. The insulating layer is away from a surrounding of the lower pad layer so that a space having a recess on a surface between the lower pad layer and the insulating layer is formed. The upper pad layer covers over the lower pad layer and the space, extends to an upper face of the insulating layer, and has an area larger than that of the lower pad layer.

8 Claims, 8 Drawing Sheets

SEMICONDUCTOR DEVICE, ELECTRONIC DEVICE AND FABRICATION METHOD OF THE SAME

BACKGROUND OF THE INVENTION

1. Field of the Invention

This invention generally relates to a semiconductor device, an electronic device and a fabrication method of the same, and in particular, relates a semiconductor device and an electronic device having a pad electrode and a fabrication method of the same.

2. Description of the Related Art

A semiconductor device using a high frequency wave such as a microwave or a milliwave is used in an electronic device such as a cellular phone or a satellite receiver. In the semiconductor device or in the electronic device, a semiconductor substrate (semiconductor chip) having an active element or a passive element is mounted on a package or on a mounting substrate in the electronic device. A pad electrode is provided on the semiconductor substrate. The pad electrode is used for electronic connection between the semiconductor chip and the package or the mounting substrate.

Figure 1A:
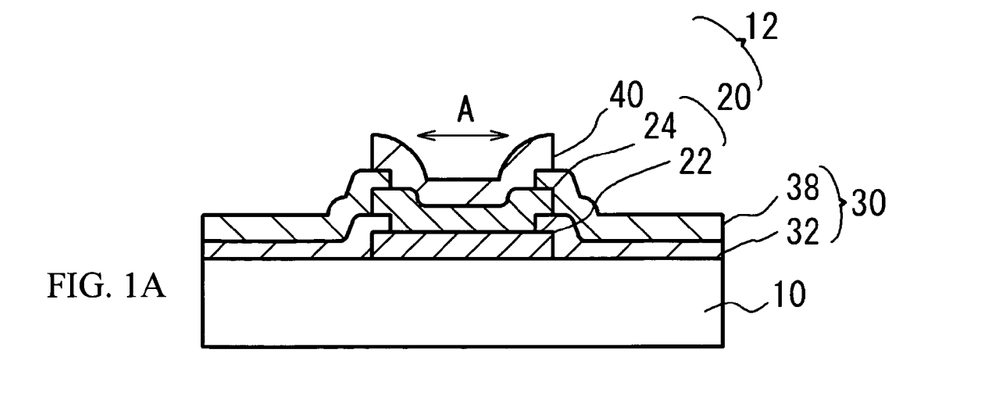
FIG. 1A and FIG. 1B illustrate a cross sectional view of a semiconductor device in accordance with a conventional embodiment.
Figure 1B:
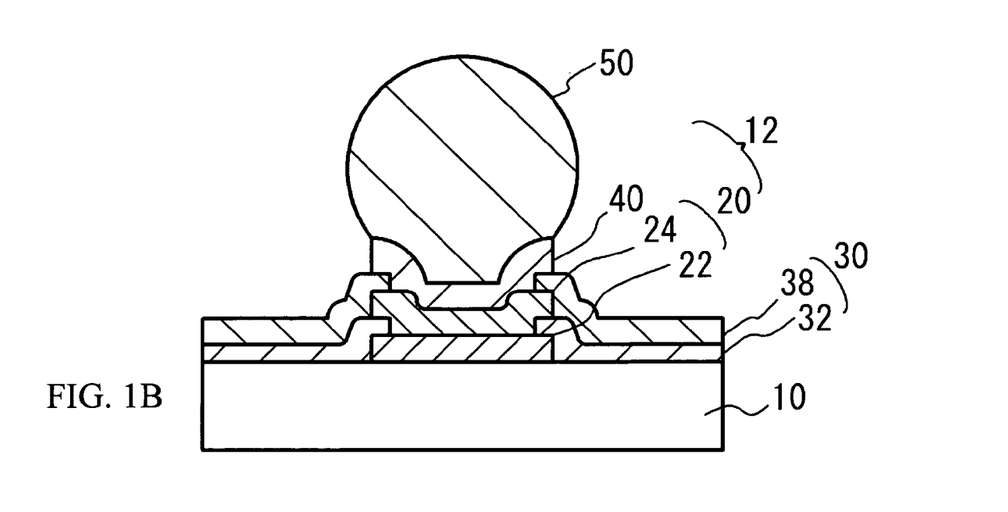

FIG. 1A and FIG. 1B illustrate a structure of the pad electrode of a semiconductor chip in accordance with a conventional embodiment. As shown in FIG. 1A, a first pad layer 22 is provided on a semiconductor substrate 10. A first insulating layer 32 is provided on the semiconductor substrate 10 and on a surrounding of the first pad layer 22. A second pad layer 24 is provided on the first pad layer 22. A lower pad layer 20 is composed of the first pad layer 22 and the second pad layer 24. A second insulating layer 38 is provided on the first insulating layer 32 and on a surrounding of the lower pad layer 20. An upper pad layer 40 is provided on the lower pad layer 20. A pad electrode 12 is composed of the lower pad layer 20 and the upper pad layer 40. As shown in FIG. 1B, a connecting terminal 50 is provided on the upper pad layer 40. The connecting terminal 50 is composed of a solder for connecting the pad electrode electrically to a package or a mounting substrate on which the semiconductor chip is mounted. Japanese Patent Application Publication No. 9-205096 discloses a case where the lower pad layer 20 is composed of a layer.

In the conventional embodiment, the first pad layer 22 and the second pad layer 24 of the lower pad layer 20 are used for a wiring of the semiconductor chip. And a metal having a low electrical resistance such as Au is used for the first pad layer 22 and the second pad layer 24. A bump such as a solder is used as the connecting terminal 50 in order to connect the pad electrode electrically to a package or a mounting substrate. A material acting as a barrier layer is used as the upper pad layer 40 in order to prevent the diffusion of a material of the lower pad layer 20 into the connecting terminal 50.

In a semiconductor device using a high frequency wave, it is necessary to reduce a capacity of the pad electrode 12. On the other hand, in a case where the connecting terminal 50 is provided on the pad electrode 12 as in the case of the conventional embodiment, it is necessary to maintain adherence intensity between the connecting terminal 50 and the pad electrode 12.

Figure 2A:
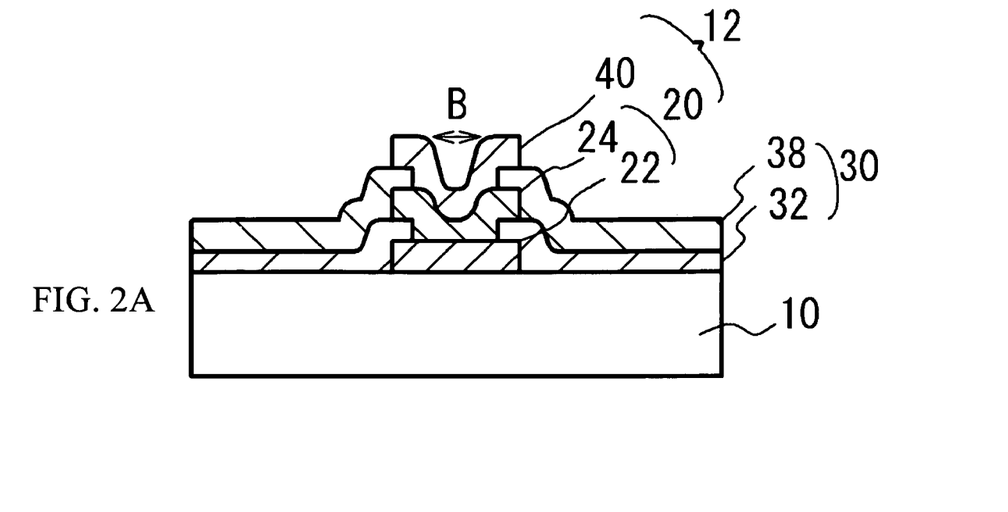
FIG. 2A and FIG. 2B illustrate a problem of the conventional embodiment.
Figure 2B:
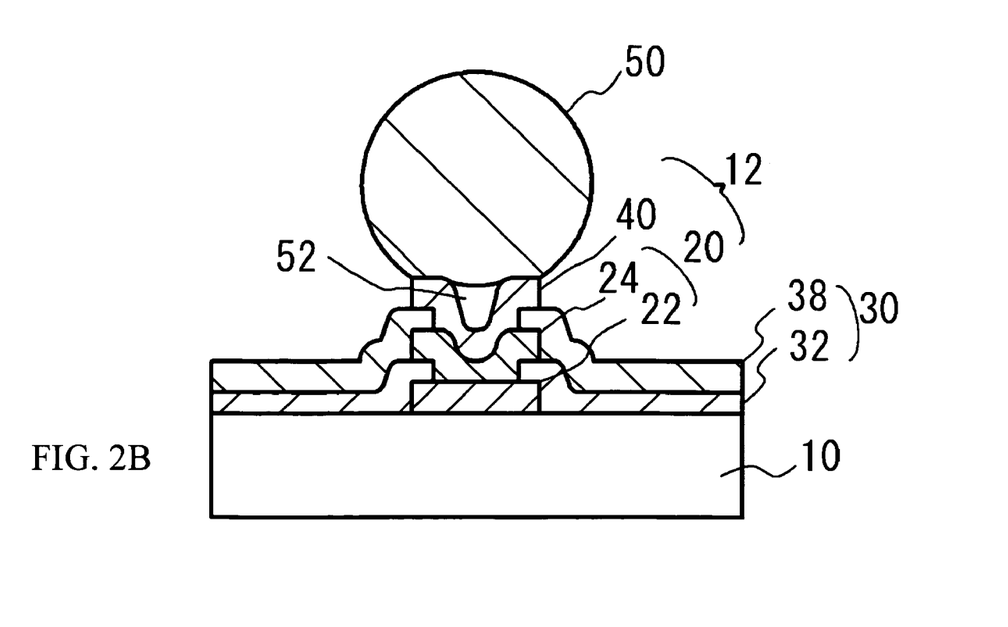

FIG. 2A and FIG. 2B illustrate a case where the pad electrode 12 is formed to be small in order to reduce the capacity of the pad electrode 12 in the conventional embodiment. As shown in FIG. 2A, when the pad electrode 12 is small, a width B of a recess on a top face of the upper pad layer 40 is smaller than a width A of a recess on a top face of the upper pad layer 40 shown in FIG. 1A. In particular, the recess is deep and has a small width, in a case where the lower pad layer 20 is composed of the first pad layer 22 and the second pad layer 24, and the first insulating layer 32 and the second insulating layer 38 cover the surrounding of the first pad layer 22 and the second pad layer 24, respectively. The width B is approximately 10 μm, in a case where a width and a length of the pad electrode 12 is less than 50 μm and a thickness of the upper pad layer 40 is 10 μm to 20 μm in order to obtain a barrier property and relax a stress. In this case, as shown in FIG. 2B, a void 52 is formed in the recess when the connecting terminal 50 is formed on the upper pad layer 40 with a printing method (metal mask). Such a void 52 may make a high electrical resistance between the upper pad layer 40 and the connecting terminal 50. That is, impedance is increased when a high frequency wave is input or output through the pad electrode 12 and the connecting terminal 50. And the impedance causes a high frequency wave loss. A contact area between the upper pad layer 40 and the connecting terminal 50 is reduced when the area of the pad electrode 12 is reduced. And the adherence intensity between the upper pad layer 40 and the connecting terminal 50 is reduced. The adherence intensity between the upper pad layer 40 and the connecting terminal 50 is further reduced when the void 52 is formed as shown in FIG. 2B. It is thus necessary to enlarge the upper region of the pad electrode.

SUMMARY OF THE INVENTION

The present invention provides a semiconductor device, an electronic device and a fabrication method thereof in which adherence intensity between a pad electrode and a connecting terminal is improved even in a case where a capacity of a pad electrode is reduced and the connecting terminal is provided on an upper pad layer.

According to an aspect of the present invention, preferably, there is provided a semiconductor device including a lower pad layer, an insulating layer and an upper pad layer. The lower pad layer is provided on a semiconductor substrate. The insulating layer is away from a surrounding of the lower pad layer so that a space having a recess on a surface between the lower pad layer and the insulating layer is formed. The upper pad layer covers over the lower pad layer and the space, extends to an upper face of the insulating layer, and has an area larger than that of the lower pad layer.

With the above-mentioned configuration, in a case where a capacity of the pad electrode is reduced and a connecting terminal is provided on the upper pad layer, adherence intensity between the pad electrode and the connecting terminal is improved. And adherence intensity between the upper pad layer and the insulating layer is improved because of an area of the recess, because the space having the recess formed by the arrangement of the insulating layer is formed between the upper pad layer and the insulating layer.

According to another aspect of the present invention, preferably, there is provided an electronic device including a lower pad layer, an insulating layer, an upper pad layer and a mount portion. The lower pad layer is provided on a semiconductor substrate. The insulating layer is away from a surrounding of the lower pad layer so that a space having a recess on a surface between the lower pad layer and the insulating layer is formed. The upper pad layer covers over the lower pad layer and the space, extends to an upper face of the insulating layer, and has an area larger than that of the lower pad layer. The semiconductor substrate is mounted on the mount portion.

With the above-mentioned configuration, in a case where a capacity of the pad electrode is reduced and a connecting terminal is provided on the upper pad layer, adherence intensity between the pad electrode and the connecting terminal is improved. And adherence intensity between the upper pad layer and the insulating layer is improved because of an area of the recess, because the space having the recess formed by the arrangement of the insulating layer is formed between the upper pad layer and the insulating layer.

According to another aspect of the present invention, preferably, there is provided a fabrication method of a semiconductor device. The method includes forming a lower pad layer on a semiconductor substrate, forming an insulating and forming an upper pad layer. The insulating layer is away from a surrounding of the lower pad layer so that a space having a recess on a surface between the lower pad layer and the insulating layer is formed. The upper pad layer covers over the lower pad layer and the space, extends to an upper face of the insulating layer, and has an area larger than that of the lower pad layer.

With the above-mentioned configuration, in a case where a capacity of the pad electrode is reduced and a connecting terminal is provided on the upper pad layer, adherence intensity between the pad electrode and the connecting terminal is improved. And adherence intensity between the upper pad layer and the insulating layer is improved because of an area of the recess, because the space having the recess formed by the arrangement of the insulating layer is formed between the upper pad layer and the insulating layer.

According to another aspect of the present invention, preferably, there is provided a fabrication method of an electronic device. The method includes forming a lower pad layer on a semiconductor substrate, forming an insulating layer, forming an upper pad layer and mounting the semiconductor substrate on a mount portion. The insulating layer is away from a surrounding of the lower pad layer so that a space having a recess on a surface between the lower pad layer and the insulating layer is formed. The upper pad layer covers over the lower pad layer and the space, extends to an upper face of the insulating layer, and has an area larger than that of the lower pad layer.

With the above-mentioned configuration, in a case where a capacity of the pad electrode is reduced and a connecting terminal is provided on the upper pad layer, adherence intensity between the pad electrode and the connecting terminal is improved. And adherence intensity between the upper pad layer and the insulating layer is improved because of an area of the recess, because the space having the recess formed by the arrangement of the insulating layer is formed between the upper pad layer and the insulating layer.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 3A:
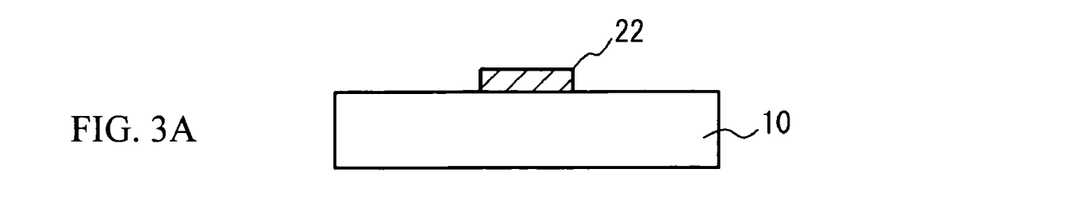
FIG. 3A through FIG. 3E illustrate a cross sectional view showing a fabrication process of a semiconductor device in accordance with a first embodiment.

FIG. 3A through FIG. 4D illustrate a cross sectional view showing a fabrication process of a semiconductor device in accordance with a first embodiment. As shown in FIG. 3A, a first pad layer 22 is formed on a semiconductor substrate 10 composed of GaAs, Si, SiC, GaN, InP or sapphire with an evaporation method or the like. The first pad layer 22 is, for example, composed of Ti/Au layer in which Ti layer and an Au layer is layered in order from the semiconductor substrate 10. The first pad layer 22 acts as an electrode of a transistor formed on the semiconductor substrate 10.

Figure 3B:
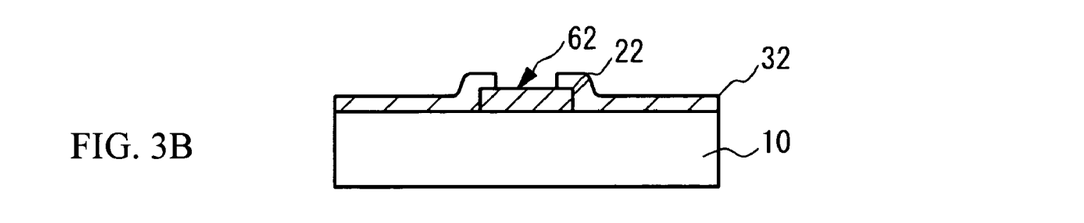

As shown in FIG. 3B, a first insulating layer 32 is formed on the semiconductor substrate 10 and the first pad layer 22. The first insulating layer 32 is, for example, composed of a nonphotosensitive polyimide. An opening 62 is formed around a center of the first insulating layer 32 on the first pad layer 22. That is, the first insulating layer 32 covers a part of an upper face of the first pad layer 22.

Figure 3C:
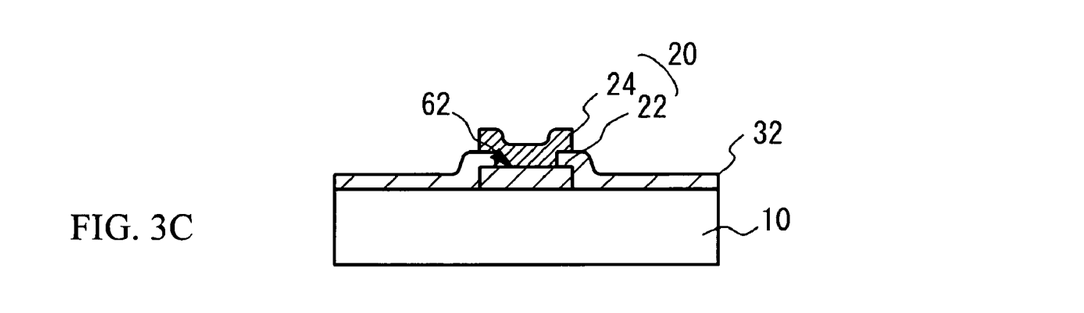

As shown in FIG. 3C, a second pad layer 24 composed of a Ti/Au layer or the like is formed on the first pad layer 22 with an evaporation method. And the second pad layer 24 is electrically coupled to the first pad layer 22 through the opening 62 of the first insulating layer 32. The first pad layer 22 and the second pad layer 24 form a lower pad layer 20.

Figure 3D:
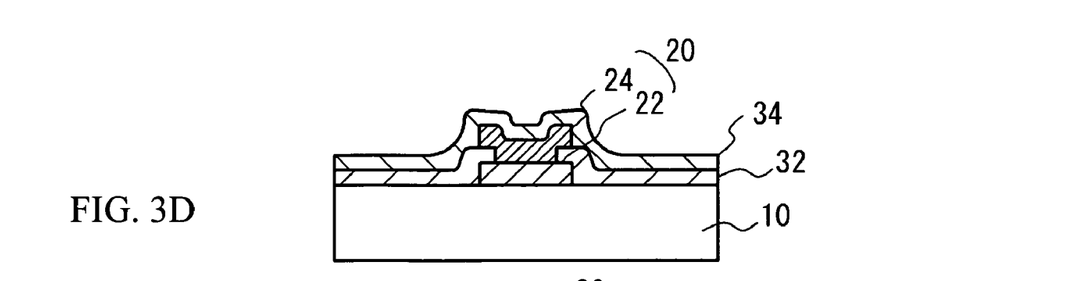
Figure 3E:
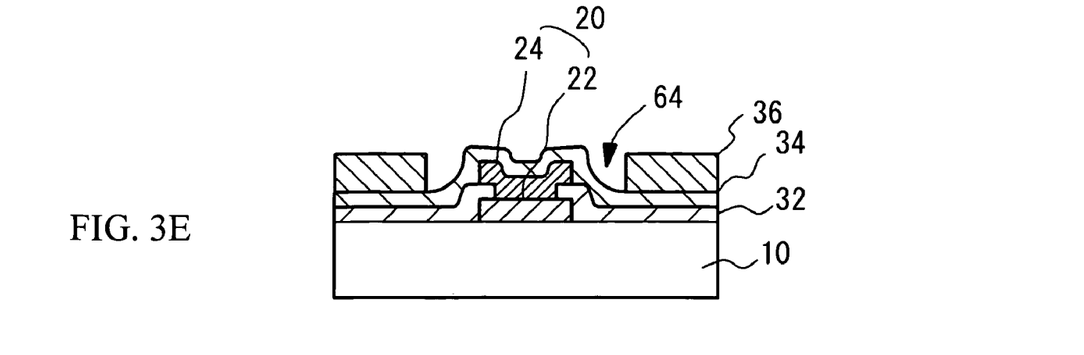

As shown in FIG. 3D, a third insulating layer 34 composed of silicon nitride or the like is formed on the first insulating layer 32 and the lower pad layer 20. As shown in FIG. 3E, a photosensitive polyimide resin is coated on the third insulating layer 34. And a fourth insulating layer 36 having an opening around the lower pad layer 20 is formed with exposure/development.

Figure 4A:
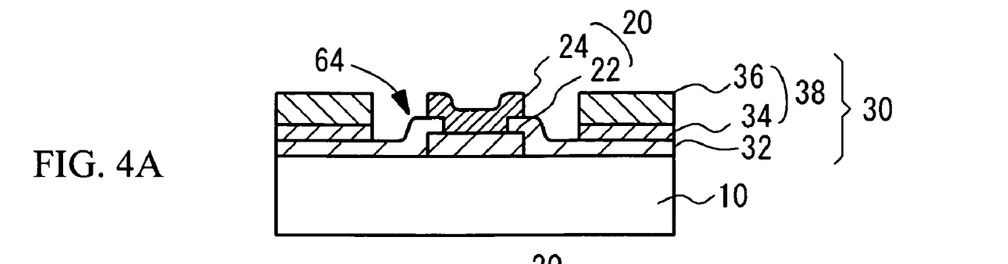
FIG. 4A through FIG. 4D illustrate a cross sectional view showing a fabrication process of a semiconductor device in accordance with the first embodiment.
Figure 4B:
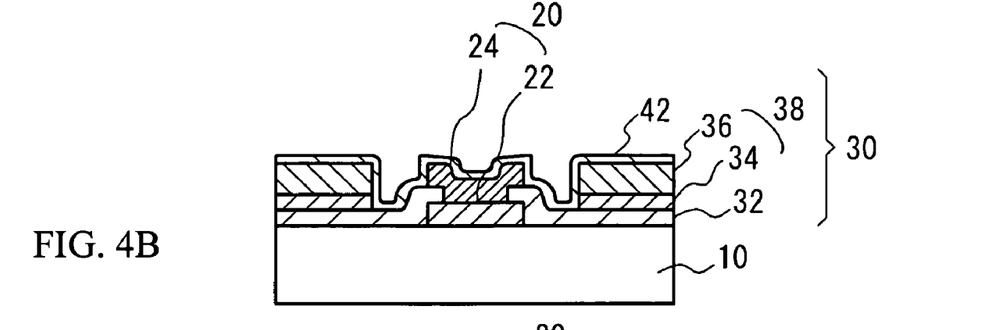

As shown in FIG. 4A, the third insulating layer 34 is etched with use of the fourth insulating layer 36 for a mask. And the upper face of the second pad layer 24 is exposed. The third insulating layer 34 and the fourth insulating layer 36 form a second insulating layer 38. The lower pad layer 20 is surrounded by the first insulating layer 32 and the second insulating layer 38. And a protective layer 30 is formed from the first insulating layer 32 and the second insulating layer 38. The protective layer 30 is approximately as tall as the lower pad layer 20. The second insulating layer 38 is arranged at a given interval from the lower pad layer 20. That is, the second insulating layer 38 is away from the lower pad layer 20. The second insulating layer 38 and the lower pad layer 20 form a space 64. The space 64 has a recess on an area between the second insulating layer 38 and the lower pad layer 20, the area being on the first insulating layer 32. As shown in FIG. 4B, a seed metal layer 42 is formed on the protective layer 30 and the lower pad layer 20. The seed metal layer 42 is composed of a Ti/Au layer or the like and is for plating.

Figure 4C:
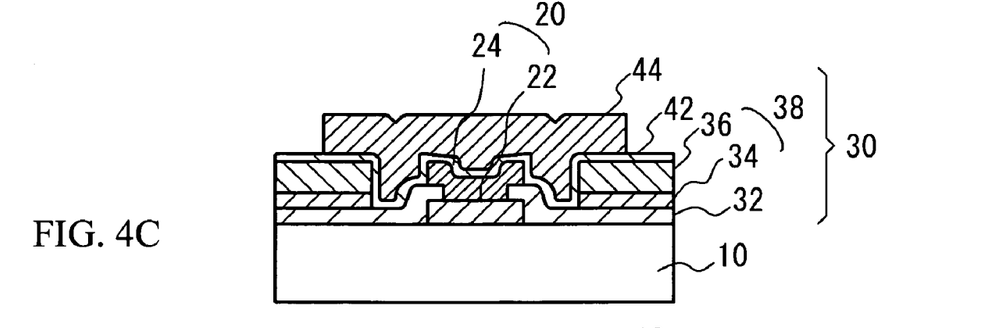

As shown in FIG. 4C, a plated layer 44 is formed on the seed metal layer 42 and above the lower pad layer 20 and the second insulating layer 38 with a plating method. The plated layer 44 is, for example, composed of a Ni layer.

Figure 4D:
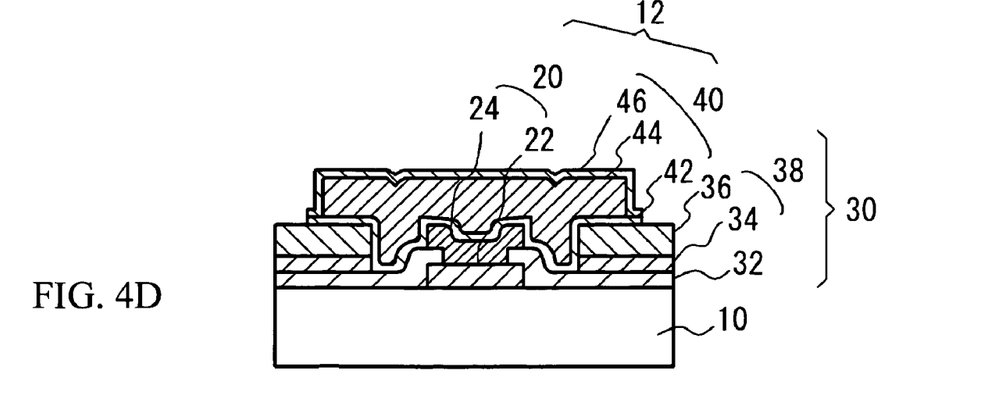
Figure 5:
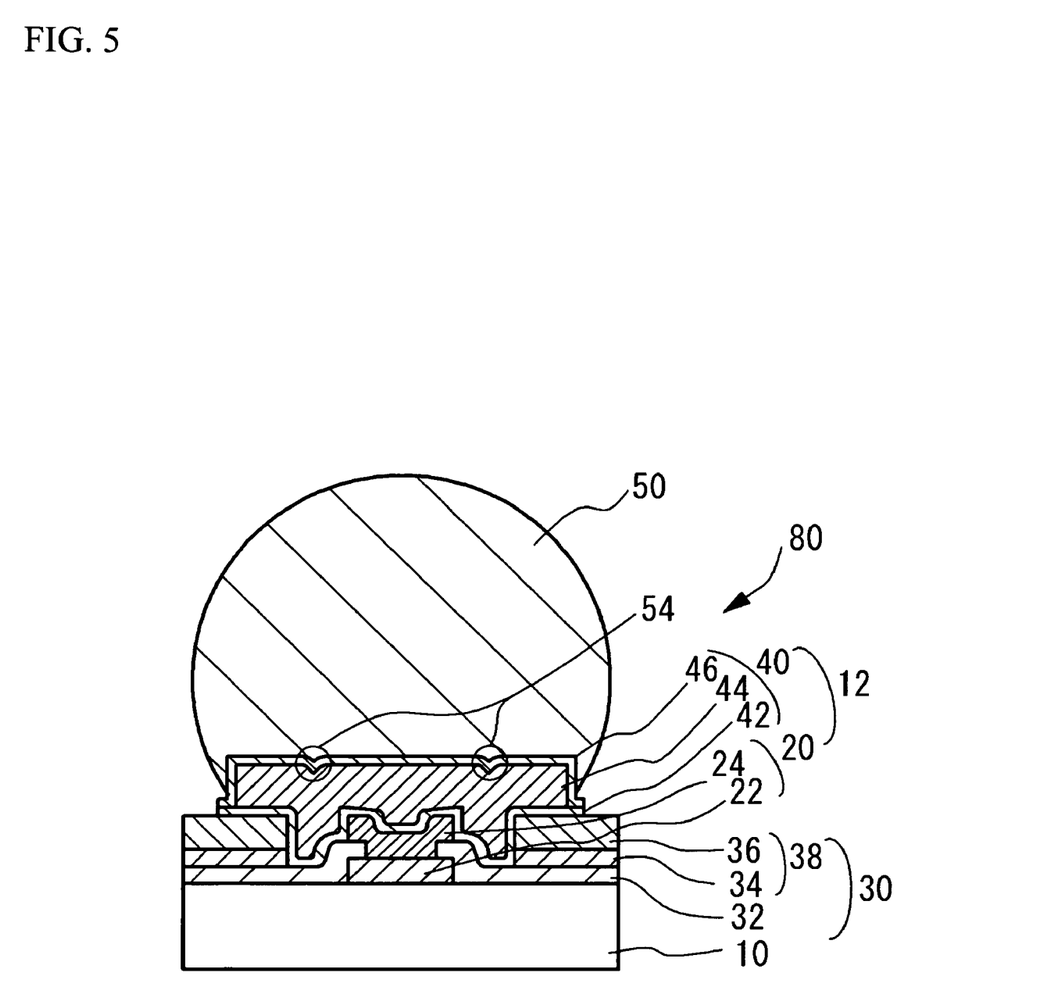
FIG. 5 illustrates a cross sectional view of the semiconductor device in accordance with the first embodiment.

As shown in FIG. 4D, a cover layer 46 is formed so as to cover the plated layer 44. The cover layer 46 is, for example, composed of a Ti/Au layer. That is, a metal layer is formed on a top face of an upper pad layer 40. A part of the seed metal layer 42 and the cover layer 46 is etched, the part being except for an area to be the upper pad layer 40. Through the processes mentioned above, the upper pad layer 40 is formed on the lower pad layer 20 and the protective layer 30, the upper pad layer 40 being composed of the seed metal layer 42, the plated layer 44 and the cover layer 46. The upper pad layer 40 covers over the lower pad layer 20 and the space 64, and extends to an upper face of the second insulating layer 38. In other words, the upper pad layer 40 is formed so as to cover an upper face of the lower pad layer 20 and a side face and a bottom face of the space 64. Through the processes, a semiconductor device 80 is fabricated. As shown in FIG. 5, a connecting terminal 50 composed of a solder is formed on the upper pad layer 40 with a printing method.

In the semiconductor device in accordance with the first embodiment, the lower pad layer 20 is formed on the semiconductor substrate 10 as shown in FIG. 5. The second insulating layer 38 is formed on the semiconductor substrate 10 so as to be away from the surrounding of the lower pad layer 20. The space (the space 64 in FIG. 4A) having a recess between the second insulating layer 38 and the lower pad layer 20 is formed. The upper pad layer 40 covers over the lower pad layer 20 and the space 64. The upper pad layer 40 extends to an upper face of the second insulating layer 38. The upper pad layer 40 has an area larger than that of the lower pad layer 20. The upper pad layer 40 is, for example, 100 μm in width and 100 μm in length. The lower pad layer 20 is, for example, 50 μm in width and 50 μm in length.

In accordance with the first embodiment, the contact area between the lower pad layer 20 and the semiconductor substrate 10 (or a substrate layer of the semiconductor substrate) is a small area that is 50 μm in width and 50 μm in length. And the capacity of a pad electrode 12 is reduced. Particularly in a semiconductor device using a high frequency wave, it is necessary that the area of the pad electrode 12 contacting to the semiconductor substrate 10 is smaller than an area that is 100 μm in width and 100 μm in length and is preferably smaller than an area that is 50 μm in width and 50 μm in length. On the other hand, the contact area between the upper pad layer 40 and the connecting terminal 50 is a large area that is 100 μm in width and 100 μm in length. And the adherence intensity between the upper pad layer 40 and the connecting terminal 50 is improved.

In the first embodiment, the upper pad layer 40 covers over the lower pad layer 20 and the space 64 and extends to the upper face of the second insulating layer 38 that is an insulating layer away from the surrounding of the lower pad layer 20. That is, the second insulating layer 38 is not provided above the surrounding area of the lower pad layer 20. In other words, the upper pad layer 40 is formed so as to contact to whole of the upper face of the lower pad layer 20. It is thus possible to restrain that a recess shown in FIG. 2A is formed on the upper face of the upper pad layer 40. Therefore, a void 52 shown in FIG. 2B is not formed and it is possible to restrain that the impedance of the pad electrode 12 and the connecting terminal 50 increases. And it is possible to prevent the reduction of the adherence intensity between the upper pad layer 40 and the connecting terminal 50 caused by the void 52. Further, a contact area between the upper pad layer 40 and the second insulating layer 38 and the lower pad layer 20 is increased because the space 64 is provided. And the adherence intensity between the upper pad layer 40 and the second insulating layer 38 and the lower pad layer 20 is improved. It is preferable that a material and a composition of the second insulating layer 38 are selected according to the adherence between the upper pad layer 40 and the second insulating layer 38. In the first embodiment, it is possible to enlarge a range of selection of the material and the composition of the second insulating layer 38, because the adherence intensity between the upper pad layer 40 and the second insulating layer 38 and the lower pad layer 20 is increased. Further, a recess 54 is formed on the upper face of the upper pad layer 40 above the space 64. Therefore, the adherence intensity between the pad electrode 12 and the connecting terminal 50 is improved.

It is preferable that the upper face and the side face of the upper pad layer 40 are covered with Au. In a case where the connecting terminal 50 is composed of a solder, the adherence intensity between the pad electrode 12 and the connecting terminal 50 is further increased. And the adherence intensity between the pad electrode 12 and the connecting terminal 50 is further increased because the connecting terminal 50 is provided on the side face of the upper pad layer 40 as shown in FIG. 5.

An area of the upper face of the upper pad layer 40 is larger than that of the bottom face of the lower pad layer 20. That is, the area of the upper face of the upper pad layer 40 is larger than that of the lower pad layer 20 that contacts to the semiconductor substrate 10. And the area of the upper pad layer 40 contacting to the connecting terminal 50 is larger than that of the lower pad layer 20 contacting to the semiconductor substrate 10. It is therefore possible to reduce the capacity of the pad electrode 12 and is possible to obtain the adherence intensity between the pad electrode 12 and the connecting terminal 50.

It is preferable that the upper face of the lower pad layer 20 is approximately as high as the upper face of the protective layer 30. In this case, it is possible to restrain that a recess as shown in FIG. 2A is formed on the upper pad layer 40. It is therefore possible to further restrain that the void 52 shown in FIG. 2B is formed. Therefore, the upper face of the lower pad layer 20 is approximately as high as the upper face of the protective layer 30 so that the void 52 is not formed. In a case where the upper face of the protective layer 30 is higher than that of the lower pad layer 20 by more than 3 μm, the void 52 tends to be formed. On the other hand, in a case where the upper face of the protective layer 30 is lower than that of the lower pad layer 20 by more than 3 μm, the solder tends to run off during the mounting. It is preferable that the differential between the heights of the upper face of the protective layer 30 and the lower pad layer 20 is less than 3 μm, in the case where the upper face of the lower pad layer 20 is approximately as high as the upper face of the protective layer 30.

The lower pad layer 20 includes the first pad layer 22 provided on the semiconductor substrate 10 and the second pad layer 24 provided on the first pad layer 22. The first insulating layer 32 (the lower insulating layer) is provided between the semiconductor substrate 10 and the second insulating layer 38 and covers a part of the upper face of the first pad layer 22. In the structure, a recess tends to be formed on an upper face of the second pad layer 24, because the first insulating layer 32 is formed on the surrounding area of the first pad layer 22. A recess shown in FIG. 2A tends to be formed on the upper face of the upper pad layer 40 when the area of the pad electrode 12 is reduced. And the void 52 shown in FIG. 2B tends to be formed between the upper pad layer 40 and the connecting terminal 50. It is possible to restrain the formation of the recess on the upper pad layer 40 in the structure in which a recess tends to be formed on the upper face of the lower pad layer 20 and a recess is formed on the upper pad layer 40. It is therefore possible to restrain the formation of the void between the upper pad layer 40 and the connecting terminal 50 in a case where the connecting terminal 50 is provided on the upper pad layer 40.

Figure 6:
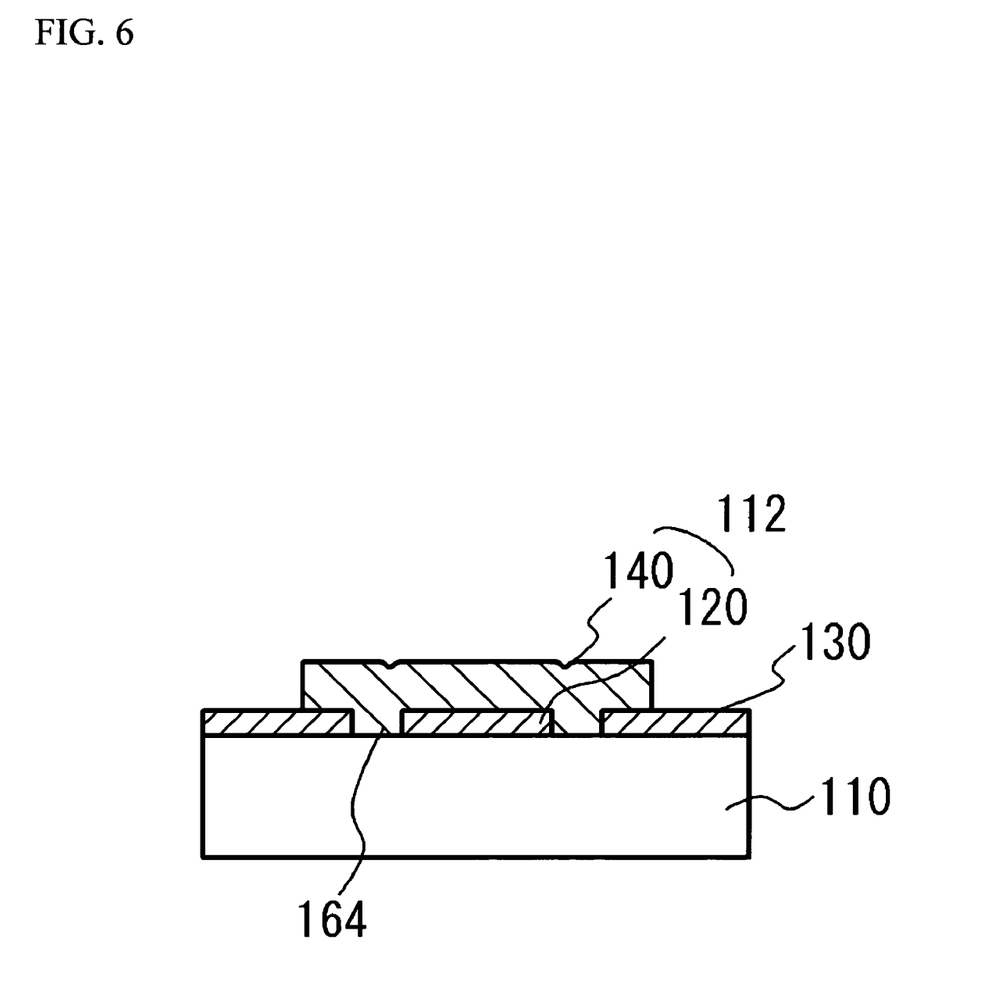
FIG. 6 illustrates a cross sectional view of a semiconductor device in accordance with another example of the first embodiment.

FIG. 6 illustrates a cross sectional view of a semiconductor device in accordance with another example of the first embodiment. A lower pad layer 120 composed of a Ti/Au layer or the like is provided on a semiconductor substrate 110. An insulating layer 130 composed of a silicon nitride layer or the like is provided on the semiconductor substrate 110. The insulating layer 130 is away from a surrounding of the lower pad layer 120. A space 164 having a recess on a surface between the lower pad layer 120 and the insulating layer 130 is formed. An upper pad layer 140 is, for example, composed of an Au/Ni/Au layer. The upper pad layer 140 covers over the lower pad layer 120 and the space 164 and extends to an upper face of the insulating layer 130. The upper pad layer 140 has an area larger than that of the lower pad layer 120. The upper pad layer 140 and the lower pad layer 120 form a pad electrode 112. In this example, it is possible to obtain the same advantage as the first embodiment.

The insulating layer arranged to be away from the surrounding of the lower pad layer 20 or 120 may be the second insulating layer 38 composed of two insulating layers or the insulating layer 130 in the example composed of one layer. The first insulating layer 32 may be provided between the second insulating layer 38 away from the surrounding of the lower pad layer 20 and the semiconductor substrate 10. The first insulating layer 32 may be provided on the semiconductor substrate 10 directly, similarly to the insulating layer 130.

Second Embodiment

Figure 7:
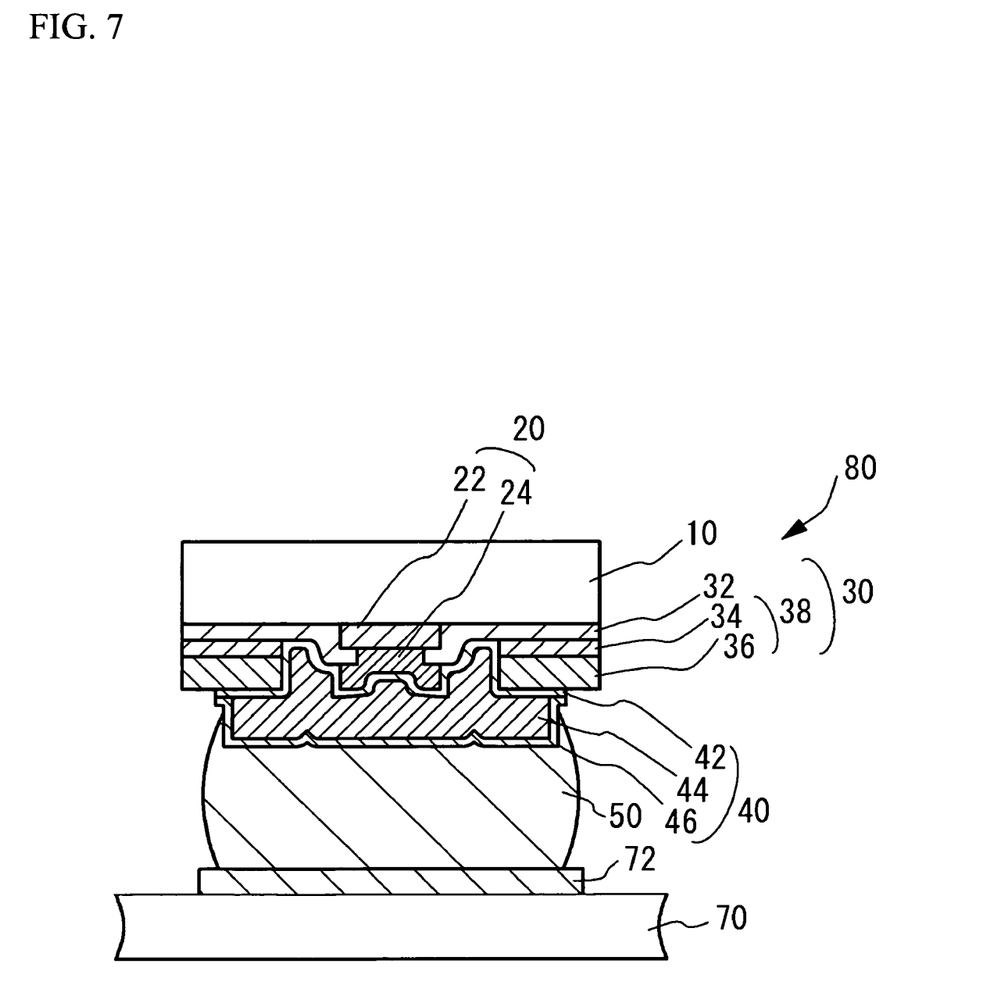
FIG. 7 illustrates a cross sectional view of an electronic device in accordance with a second embodiment.

A second embodiment is an example of an electronic device in which the semiconductor device 80 in accordance with the first embodiment is mounted. As shown in FIG. 7, the connecting terminal 50 in accordance with the second embodiment is coupled to a pad electrode 72 that is provided on a mount portion 70 and is composed of Au or the like. That is, the semiconductor substrate 10 of the semiconductor device 80 is mounted face down on the mount portion 70 with the connecting terminal 50. The mount portion 70 may be a package composed of ceramics or a mount substrate such as a printing substrate. The semiconductor device 80 may be mounted flip chip, although the semiconductor device 80 is mounted face down in the second embodiment.

Figure 8:
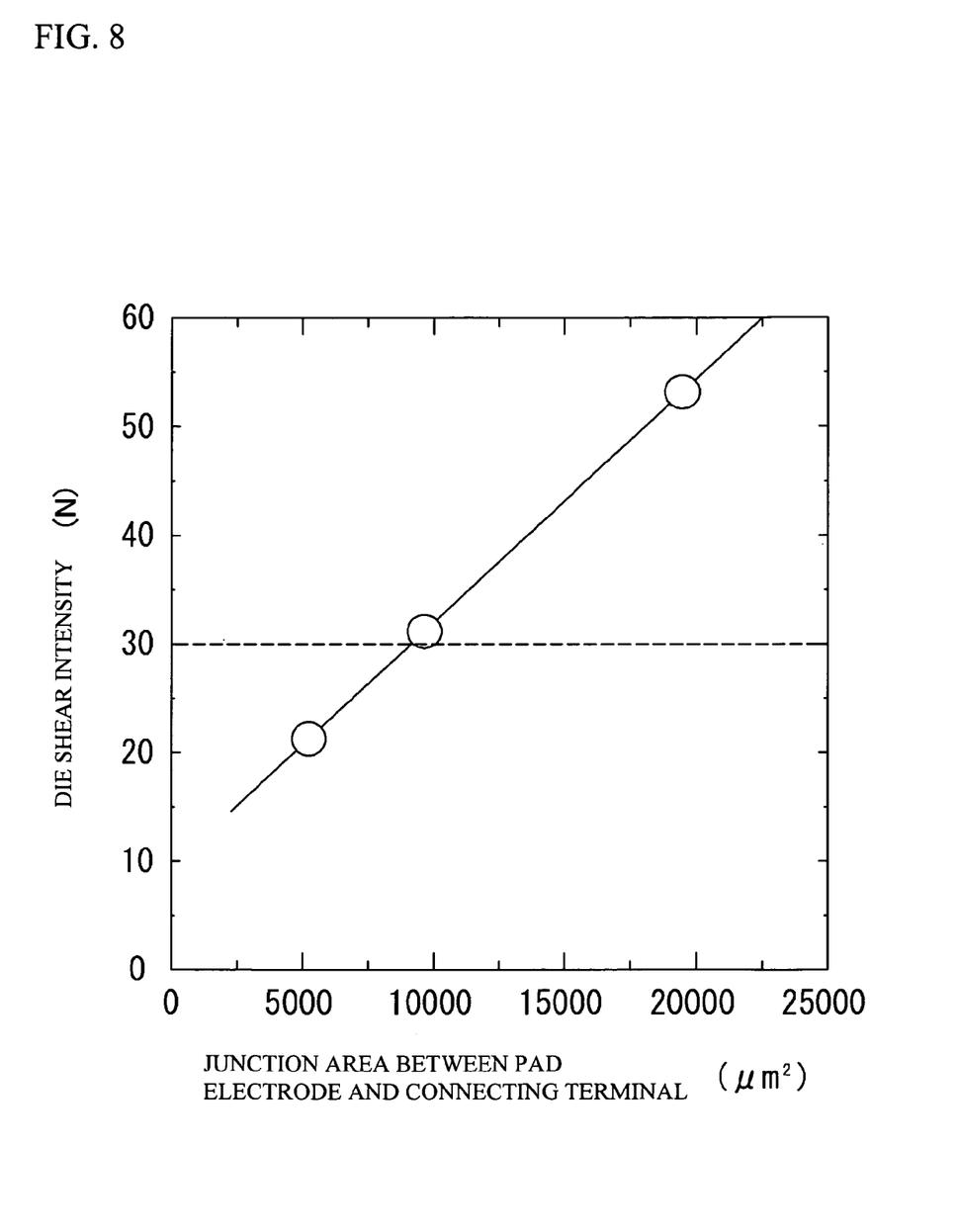
FIG. 8 illustrates a die shear intensity of the electronic device in accordance with the second embodiment.

A die shear intensity of the semiconductor device 80 mounted on the mount portion 70 is measured, in a case where the mount portion 70 is a package, the connecting terminal 50 is composed of a solder and the plated layer 44 is composed of Ni having a thickness of more than 3 μm. Open circles in FIG. 8 show the results. FIG. 8 illustrates a die shear intensity of the semiconductor device 80 with respect to the junction area between the solder of the connecting terminal 50 and the upper pad layer 40. When the junction area is enlarged, the die shear intensity increases. It is necessary that the junction area is more than 10,000 μm$^2$, if the die shear intensity is more than 30 N.

In accordance with the second embodiment, the junction area between the solder and the upper pad layer 40 is a large area that is 100 μm in width and 100 μm in length as shown in FIG. 8, if the semiconductor device 80 in accordance with the first embodiment is used. Therefore the die shear intensity is increased. On the other hand, the contact area between the lower pad layer 20 and the semiconductor substrate 10 (or a semiconductor layer of the semiconductor substrate) is small area that is 50 μm in width and 50 μm in length as in the case of the first embodiment. Therefore, the capacity of the pad electrode 12 is reduced. The second embodiment is a case where the connecting terminal 50 is formed on the pad electrode 12 of the semiconductor device 80 and the semiconductor device 80 is mounted on the mount portion 70. The connecting terminal 50 may be formed on the mount portion 70 and the semiconductor substrate 10 may be mounted on the mount portion 70 with the connecting terminal 50. The semiconductor device of another example of the first embodiment may be mounted on the mount portion 70.

In the first embodiment, in another example of the first embodiment, and in the second embodiment, the lower pad layer 20 may be composed of a metal except for Au. The lower pad layer 20 acts as an electrode and a wire of an element provided on the semiconductor substrate 10. In this case, it is preferable that the lower pad layer 20 is composed of a low-resistivity metal. The upper pad layer 40 may be composed of a metal except for Ni. The upper pad layer 40 may be composed of copper.

It is preferable that the upper pad layer 40 is composed of a metal acting as a barrier layer between the connecting terminal 50 and the lower pad layer 20. In a case where the upper pad layer 40 is composed of a Ni layer and the connecting terminal 50 is composed of a solder, it is preferable that the thickness of the Ni layer acting as a barrier layer of the solder is more than 3 μm. In a case where the upper pad layer 40 is used as a layer relaxing a stress of the connecting terminal 50, it is preferable that the thickness of the upper pad layer 40 is more than 10 μm. The insulating layers 32, 34 and 36 and the insulating layer 130 may be composed of an inorganic layer such as silicon nitride layer or an organic layer such as polyimid resin layer. The connecting terminal 50 may be composed of a metal except for the solder. The connecting terminal 50 is composed of a metal to be electrically coupled to the mount portion 70.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-054174 filed on Feb. 28, 2006, the entire disclosure of which is hereby incorporated by reference.

What is claimed is:

1. A semiconductor device, comprising:
    a lower pad layer provided on a semiconductor substrate;
    an insulating layer that is away from a surrounding of the lower pad layer so that a space having a recess on a surface between the lower pad layer and the insulating layer is formed; and
    an upper pad layer that covers an entire area over the lower pad layer and the space, that extends to an upper face of the insulating layer, and that has an area larger than that of the lower pad layer, a pad electrode being formed of the lower pad layer and the upper pad layer.

2. The semiconductor device as claimed in claim 1, wherein:
    the lower pad layer has a first pad layer provided on the semiconductor substrate and a second pad layer provided on the first pad layer; and
    the semiconductor device has a lower insulating layer that is provided between the semiconductor substrate and the insulating layer and that covers a part of an upper face of the first pad layer.

3. The semiconductor device as claimed in claim 1, wherein an upper face and a side face of the upper pad layer is covered with Au.

4. The semiconductor device as claimed in claim 1, further comprising a connecting terminal provided on the upper pad layer.

5. An electronic device, comprising:
- a lower pad layer provided on a semiconductor substrate;
- an insulating layer that is away from a surrounding of the lower pad layer so that a space having a recess on a surface between the lower pad layer and the insulating layer is formed;
- an upper pad layer that covers an entire area over the lower pad layer and the space, that extends to an upper face of the insulating layer, and that has an area larger than that of the lower pad layer, a pad electrode being formed of the lower pad layer and the upper pad layer; and
- a mount portion on which the semiconductor substrate is mounted.

6. The electronic device as claimed in claim 5, wherein:
- the lower pad layer has a first pad layer provided on the semiconductor substrate and a second pad layer provided on the first pad layer; and
- the semiconductor device has a lower insulating layer that is provided between the semiconductor substrate and the insulating layer and that covers a part of an upper face of the first pad layer.

7. The electronic device as claimed in claim 5, further comprising a connecting terminal provided on the upper pad layer,
wherein the semiconductor substrate is mounted on the mount portion with the connecting terminal.

8. The electronic device as claimed in claim 5, further comprising a connecting terminal provided on the mount portion on which the semiconductor substrate is mounted,
wherein the semiconductor substrate is mounted on the mount portion with the connecting terminal.

* * * * *